US008781410B2

United States Patent
Deguchi (10) Patent No.: US 8,781,410 B2
(45) Date of Patent: Jul. 15, 2014

(54) RADIO COMMUNICATION DEVICE, TRANSMISSION CIRCUIT AND BUFFER CIRCUIT

(75) Inventor: Jun Deguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 202 days.

(21) Appl. No.: 13/237,069

(22) Filed: Sep. 20, 2011

(65) Prior Publication Data

US 2012/0238221 A1 Sep. 20, 2012

(30) Foreign Application Priority Data

Mar. 17, 2011 (JP) .................................. 2011-059405

(51) Int. Cl.
*H03L 5/00* (2006.01)
*H04B 1/40* (2006.01)
*H04B 1/02* (2006.01)

(52) U.S. Cl.
USPC ................................ 455/91; 455/84; 327/333

(58) Field of Classification Search
USPC .............. 455/39, 59, 73, 78, 84, 86, 91, 130; 327/333
See application file for complete search history.

(56) References Cited

U.S. PATENT DOCUMENTS

| 7,127,219 | B2 * | 10/2006 | Nitta | 455/126 |
| 7,471,926 | B2 * | 12/2008 | Oga | 455/1 |
| 7,750,730 | B2 * | 7/2010 | Irino | 327/557 |
| 2008/0106298 | A1 * | 5/2008 | Bales | 326/30 |
| 2008/0309401 | A1 * | 12/2008 | Sato | 327/581 |
| 2009/0153198 | A1 * | 6/2009 | Augustyniak et al. | 327/96 |
| 2011/0089991 | A1 * | 4/2011 | Rangarajan et al. | 327/427 |
| 2011/0234290 | A1 * | 9/2011 | Ramamurthy | 327/332 |

FOREIGN PATENT DOCUMENTS

JP 06-069727 3/1994

OTHER PUBLICATIONS

Japanese Office Action issued on May 31, 2013 and English translation thereof.

* cited by examiner

*Primary Examiner* — Andrew Wendell
*Assistant Examiner* — Maryam Soltanzadeh
(74) *Attorney, Agent, or Firm* — White & Case LLP (57) ABSTRACT

According to one embodiment, a buffer circuit has a capacitor comprising a first terminal and a second terminal, an input signal being inputted to the first terminal, a first inverting amplifier circuit configured to invert and amplify a signal of the second terminal of the capacitor, a second inverting amplifier circuit configure to invert and amplify an output signal of the first inverting amplifier circuit, and a MOS (Metal Oxide Semiconductor) transistor comprising a third terminal, a fourth terminal and a gate, the third terminal being connected to the second terminal of the capacitor, the fourth terminal being connected to a connection node of the first and the second inverting amplifier circuits, an inversion signal of the input signal being inputted to the gate.

8 Claims, 6 Drawing Sheets

RADIO COMMUNICATION DEVICE, TRANSMISSION CIRCUIT AND BUFFER CIRCUIT

CROSS REFERENCE TO RELATED APPLICATIONS

This application is based upon and claims the benefit of priority from the prior Japanese Patent Application No. 2011-59405, filed on Mar. 17, 2011, the entire contents of which are incorporated herein by reference.

FIELD

Embodiments described herein relate generally to a radio communication device, a transmission circuit and a buffer circuit.

BACKGROUND

In radio communication devices represented by cellular phones, an LO (Local Oscillator) signal is used as a reference signal for modulation and demodulation. In recent years, multiple antennas, modulation circuits and demodulation circuits are provided (Multiple Input Multiple Output) to improve communication rate. Therefore, an area of a transmission and reception chip becomes larger, and thus, it becomes necessary to transmit the LO signal from a VCO (Voltage Controlled Oscillator) for generating the LO signal to the modulation circuit or demodulation circuit for a long distance.

Furthermore, it is desired for the radio communication devices to be compatible to a plurality of wireless standards. Accordingly, the radio communication devices should transmit and receive signals having various frequencies.

DETAILED DESCRIPTION

In general, according to one embodiment, a radio communication device has at least one of a signal transmitter and a signal receiver. The signal transmitter has a signal transmission circuit configured to modulate an input radio signal inputted from an outside based on a first oscillation signal, and to transmit the modulated input radio signal from an antenna, and a first transmission circuit configured to transmit the first oscillation signal to the signal transmission circuit. The signal receiver has a signal reception circuit configured to demodulate a reception signal received at the antenna based on the first oscillation signal or based on a second oscillation signal different from the first oscillation signal, and to output the demodulated reception signal to an outside, and a second transmission circuit configured to transmit the first or second oscillation signal to the signal reception circuit. Each of the first and the second transmission circuits has a plurality of buffer circuits connected in series. Each of the buffer circuits has a capacitor comprising a first terminal and a second terminal, an input signal being inputted to the first terminal, a first inverting amplifier circuit configured to invert and amplify a signal of the second terminal of the capacitor, a second inverting amplifier circuit configure to invert and amplify an output signal of the first inverting amplifier circuit, and a MOS (Metal Oxide Semiconductor) transistor comprising a third terminal, a fourth terminal and a gate, the third terminal being connected to the second terminal of the capacitor, the fourth terminal being connected to a connection node of the first and the second inverting amplifier circuits, an inversion signal of the input signal being inputted to the gate.

Embodiments will now be explained with reference to the accompanying drawings.

Figure 1:
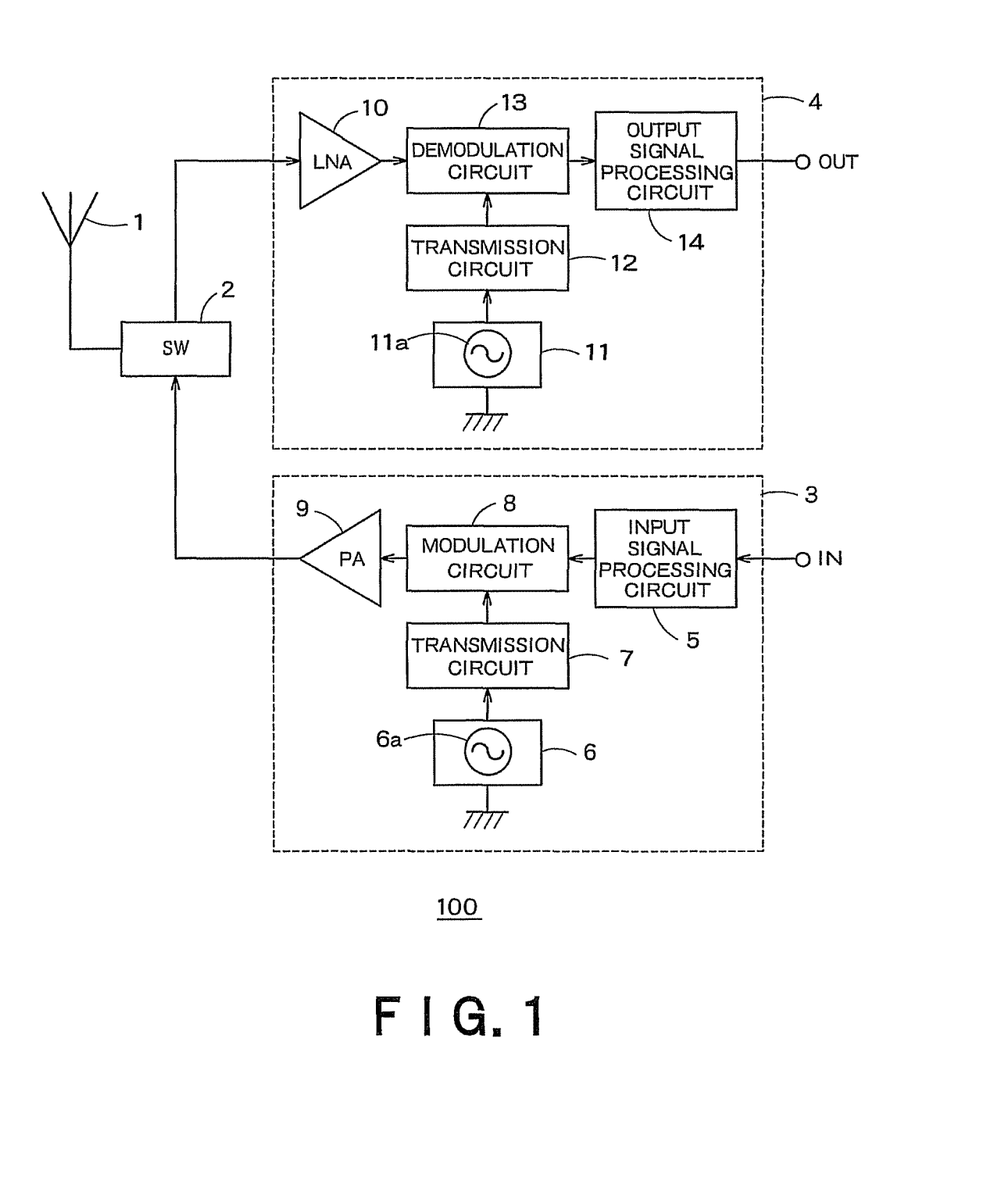
FIG. 1 is a schematic block diagram of a radio communication device 100 according to one embodiment.

FIG. 1 is a schematic block diagram of a radio communication device 100 according to one embodiment. The radio communication device 100 of FIG. 1 is mounted on a cellular phone, for example. The radio communication device 100 has an antenna 1, a switch (SW) 2, a signal transmitter 3 and a signal receiver 4. Note that, the radio communication device 100 may include only one of the signal transmitter 3 and the signal receiver 4.

The antenna 1 transmits or receives a radio signal. The switch 2 controls whether the antenna 1 transmits or receives the radio signal.

The signal transmitter 3 processes an input radio signal inputted from a baseband LSI (Large Scale Integrated circuit) etc. (not shown), and outputs the processed radio signal to the antenna 1. The signal receiver 4 processes the radio signal received by the antenna 1, and outputs the processed signal to the outside. More specifically, the signal transmitter 3 has an input signal processing circuit 5, a PLL circuit (oscillation signal generation circuit) 6, a transmission circuit 7, a modulation circuit 8 and a power amplifier (PA) 9. The input signal processing circuit 5 processes a signal inputted from the outside. The PLL circuit 6 has a VCO 6a and generates an LO signal. The transmission circuit 7 transmits the LO signal to the modulation circuit 8. Based on the transmitted LO signal, the modulation circuit 8 modulates the output signal of the input signal processing circuit 5. The power amplifier 9 amplifies the output signal of the modulation circuit 8, and outputs the amplified signal to the antenna 1. The input signal processing circuit 5, the modulation circuit 8 and the PA 9 form a signal transmission circuit.

The signal receiver 4 processes the radio signal received by the antenna 1, and output the processed radio signal to the outside. More specifically, the signal receiver 4 has an LNA (Low Noise Amplifier) 10, a PLL circuit (oscillation signal generation circuit) 11, a transmission circuit 12, a demodulation circuit 13 and an output signal processing circuit 14. The LNA 10 amplifies the radio signal received by the antenna 1. The PLL circuit 11 has a VCO 11a and generates an LO signal. The transmission circuit 12 transmit the LO signal to the demodulation circuit 13. Based on the transmitted LO signal, the demodulation circuit 13 demodulates the radio signal amplified by the LNA 10. The output signal processing circuit 14 processes the demodulated signal and outputs the processed signal to the outside. The LNA 10, the demodulation circuit 13 and the output signal processing circuit 14 form a signal transmission circuit.

Although FIG. 1 shows the radio communication device 100 in which the signal transmitter 3 has one modulation circuit 8, the radio communication device 100 can have a plurality of modulation circuits 8 in order to treat a plurality of wireless standards. Similarly, the signal receiver 4 can have a plurality of demodulation circuits 13.

The frequencies of the LO signals generated by the PLL circuits 6 and 11 vary depending on the wireless standards, for example, the frequencies may be 500 MHz to 5 GHz. More specifically, the frequency for wireless LAN (Local Area Network) apparatuses is 2.5 GHz or 5 GHz, and that for cellular phones is 900 MHz.

Therefore, the transmission circuits 7 and 12 have to transmit the LO signals from the PLL circuits 6 and 11 to the demodulation circuit 8 and modulation circuit 13, respectively with as low attenuation as possible, regardless of the frequencies of the LO signals. Hereinafter, the transmission circuit 12 will be described as a representative because the configuration of the transmission circuit 12 is similar to that of the transmission circuit 7.

Figure 2:
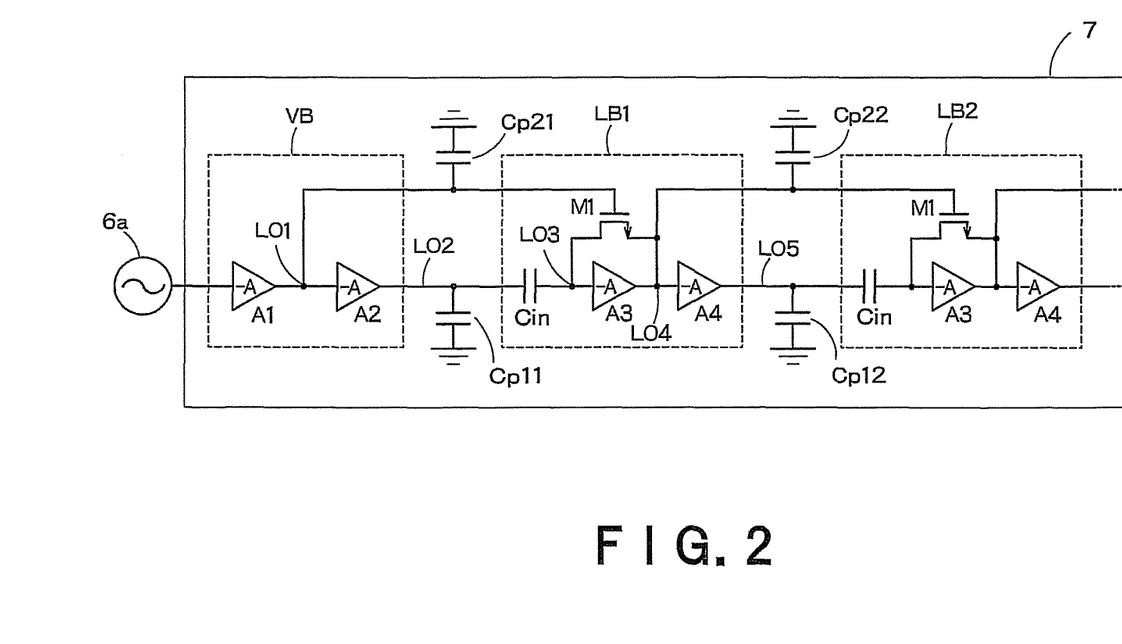
FIG. 2 is a circuit configuration of the transmission circuit 7.

FIG. 2 is a circuit configuration of the transmission circuit 7. The transmission circuit 7 has a VCO buffer VB, a plurality of LO buffers (buffer circuits) LB1, LB2 and so on which are connected in series.

The VCO buffer VB has an inverting amplifier circuit A1 for inverting and amplifying the LO signal generated by the VCO 6a, and an inverting amplifier circuit A2 for inverting and amplifying the output signal of the inverting amplifier circuit A1. Hereinafter, the output signals of the inverting amplifier circuits A1 and A2 will be referred to as signals LO1 and LO2, respectively.

The LO buffer LB1 has a capacitor Cin, inverting amplifier circuit A3 and A4, an NMOS (N-type Meal Oxide Semiconductor) transistor M1. The capacitor Cin and the inverting amplifier circuits A3 and A4 are connected in series between the input terminal of the LO buffer LB1 and the output terminal thereof. The drain and the drain of the transistor M1 are connected to the input terminal and the output terminal of the inverting amplifier circuit A3, respectively. The gate of the transistor M1 is connected to a connection node of the inverting amplifier circuits A1 and A2. Furthermore, parasitic capacitances Cp11, Cp22 and so on are formed on each wire. The explanation of the LO buffer LB2 or the like will be omitted because the configurations thereof are similar to the configuration of the LO buffer LO1.

The signal LO2 outputted from the VCO buffer VB is inputted to one terminal of the capacitor Cin. The capacitor Cin eliminates the DC component in the signal LO2. If the capacitor Cin is large, the consumption power will become large because it is necessary to generate a large current for charging/discharging the capacitor Cin. Therefore, it is preferable that the capacitor Cin is small.

The inverting amplifier circuit A3 inverts and amplifies the voltage at the other terminal of the capacitor Cin whose DC component is eliminated. The inverting amplifier circuit A4 further inverts and amplifies the output signal of the inverting amplifier circuit A3. Hereinafter, the input signal and the output signal of the inverting amplifier circuit A3 and the output signal of the inverting amplifier circuit A4 will be referred to as signals LO3, LO4 and LO5, respectively.

The transistor M1 is provided in order to set the operation point of the inverting amplifier circuit A3. More specifically, when the signal LO1 inputted to the gate of the transistor M1 is high, the transistor M1 turns on and the source and the drain are short-circuited. By such a manner, the operation point is determined as a voltage where the input voltage and the output voltage of the inverting amplifier circuit A3 coincide with each other. Note that, the phase of the signal LO1 inputted to the gate of the transistor M1 and that of the signal LO2 inputted to the one terminal of the capacitor Cin are inverted from each other.

Each of the inverting amplifier circuits A1 to A4 is, for example, a CMOS inverter formed of a PMOS transistor and a NMOS transistor connected in series.

Then, the operation of the transmission circuit 12 will be described.

Figure 3:
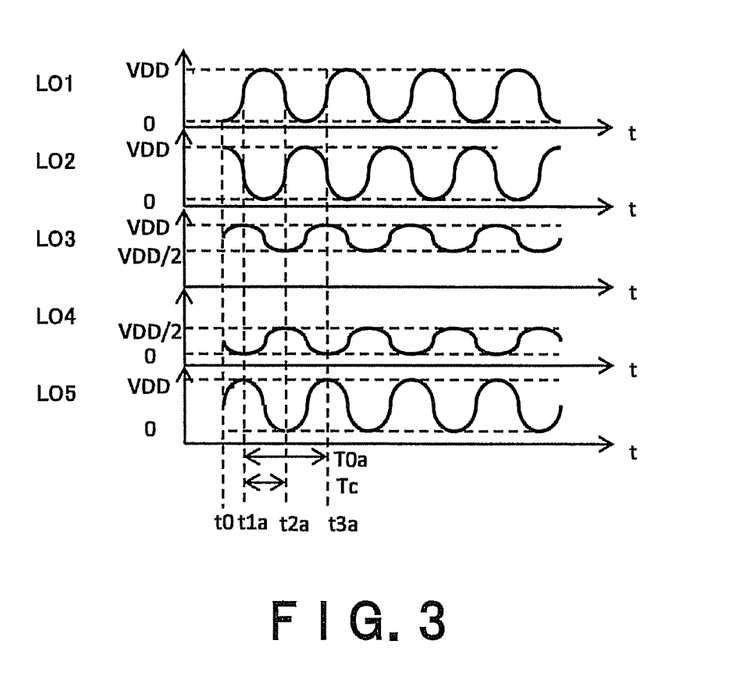
FIG. 3 is an example of a voltage waveform of each signal in FIG. 2.

FIG. 3 is an example of a voltage waveform of each signal in FIG. 2. As mentioned above, the frequency of the LO signal varies depending on the wireless standard. FIG. 3 shows the operation when the frequency is high (for example, cycle T0a=0.2 ns, that is, the frequency fa=5 GHz).

It is assumed that the signal LO1 is low at time t0 and that the signal LO1 becomes high from low at time t1a. Because of this, the transistor M1 turns on, and the source and the drain are short-circuited. Therefore, the input and the output of the inverting amplifier circuit A3 are short-circuited, and thus, the voltage of the signal LO3 begins to decrease and that of the signal LO4 begins to increase. Then, the signals LO3 and LO4 become stable at time t2a when the voltage of the signal LO3 and that of the signal LO4 coincide with each other. The voltage at this time is the operation point of the inverting amplifier circuit A3.

When the logic threshold voltage of the inverting amplifier circuit A3 is equal to VDD/2, the voltages of the signals LO3 and LO4 at time t2a are VDD/2. Even if the logic threshold voltage shifts from VDD/2 a little due to the variation of the input-output characteristic of the inverting amplifier circuit A3, the operation point can be set to be approximately VDD/2 owing to the feedback of the transistor M1. Hereinafter, the operation point is assumed to be VDD/2.

Then, it is further assumed that the signal LO1 becomes low from high at time t2a when the voltage of the signals LO3 and LO4 becomes VDD/2. Because of this, the gate of the transistor M1 becomes low which sets the transistor M1 to be off, and thus, the input and output of the inverting amplifier circuit A3 becomes electrically separated. On the other hand, the inverting amplifier circuit A2 inverts the signal LO2 from low to high. Accordingly, the signal L03, which is an input signal of the inverting amplifier circuit A3, becomes high from VDD/2 due to the capacitance coupling. This causes that the inverting amplifier circuit A4 inverts the signal LO4 from VDD/2 to high. Then, the inverting amplifier circuit A5 inverts the signal LO5 from low to high.

After that, the signal LO1 becomes high from low again at time t3a which is after a cycle T0a from time t1a. Similar to this, the transmission circuit 7 transmits the LO signal from the PLL circuit 6 to the modulation circuit 8 by inverting and amplifying the signals.

With regard to the above operation, the current flows between the source and the drain of the transistor M1 because the transistor M1 is on during time t1a to time t2a (hereinafter, referred to as term Tc). Therefore, the transistor M1 can be considered to be an on-resistance Ron. The term Tc is, mainly, a term for the inverting amplifier circuit A3 to charge the parasitic capacitance Cp22 formed on the output terminal thereof. Accordingly, the term Tc is independent of the frequency of the LO signal and is substantially constant.

On the other hand, the transistor M1 can be considered to be off-resistance Roff during time t2a to time t3a because the transistor M1 is off.

FIG. 3 shows an example where the signals LO3 and LO4 reach the voltage VDD/2 and the signal LO1 becomes low from high at time t2a. In this case, the transistor M1 is on during a half of the cycle T0a (term Tc among the cycle T0a) while it is off during another half of the cycle T0b (time t2a to time t3*a*). That is, the duty ratio of the transistor M1 is 50%. Therefore, the transistor M1 can be considered to be a resistance R=(Ron*Roff)/(Ron+Roff) in which the on-resistance Ron and the off-resistance Roff are connected in parallel. Generally, the off-resistance Roff is much larger than the on-resistance. Therefore, the transistor M1 can be considered as the resistance R=Ron.

Figure 4:
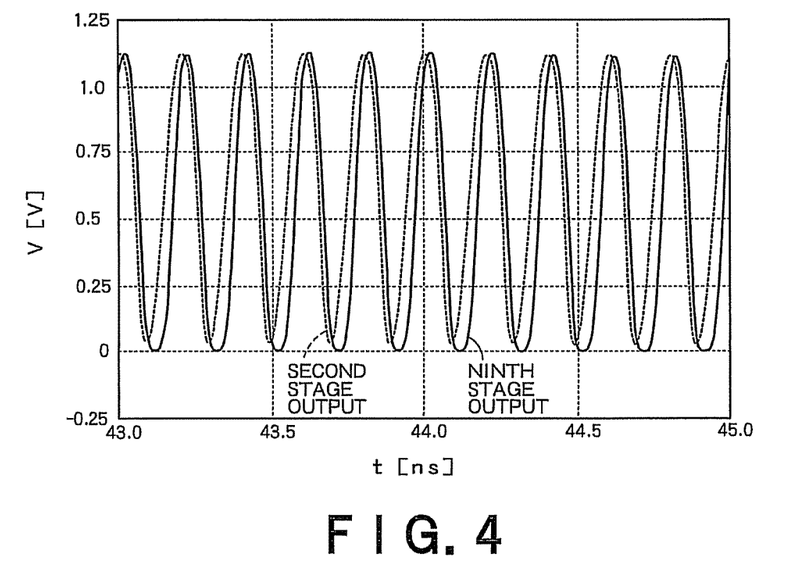
FIG. 4 is a simulation result showing a characteristic of the transmission circuit 7 of FIG. 2.

It may be possible to use a polysilicon resistance whose resistance value is Ron instead of the transistor M1. However, in general, the resistance value of the polysilicon per unit area is smaller than that of a MOS transistor having a long channel. Therefore, it is necessary to form a large polysilicon resistance. As a result, not only the circuit volume becomes large, but also the parasitic capacitances become large, which may attenuates the transmitted LO signal On the other hand, FIG. 4 is a simulation result showing a characteristic of the transmission circuit 7 of FIG. 2. The horizontal axis of FIG. 2 is time and the vertical axis thereof is a voltage. In FIG. 4, dashed lines shows an output voltage of the second LO buffer LB2, and the solid line shows an output voltage of the ninth LO buffer LO9. The frequency of the LO signal is 5 GHz, and the supply voltage VDD is 1.2V. As shown in FIG. 4, the present embodiment uses a transistor M1 instead of the polysilicon resistance, thereby decreasing the circuit area and decreasing the parasitic capacitance to suppress the attenuation of the LO signal.

Incidentally, a high pass filter is formed by the capacitor Cin in the LO buffer LB1 and the transistor M1 which can be considered to be a resistance R. The cutoff frequency of the high pass filter becomes lower as Cin*R is larger. Therefore, in order to transmit the LO signal having a high frequency (for example, 5 GHz), it is necessary to set the Cin*R to be small. On the other hand, in order to transmit the LO signal having a low frequency (for example, 500 MHz), it is necessary to set the Cin*R to be large.

As stated above, when the frequency of the LO signal is high, the resistance R is considered to be the on-resistance Ron. Therefore, in the present embodiment, the transistor M1, whose on-resistance Ron is optimized so as to transmit the LO signal having a high frequency, is formed. Even if such transistor M1 is formed, the LO signal having a low frequency also can pass the high pass filter, which will be mainly explained hereinafter.

Figure 5:
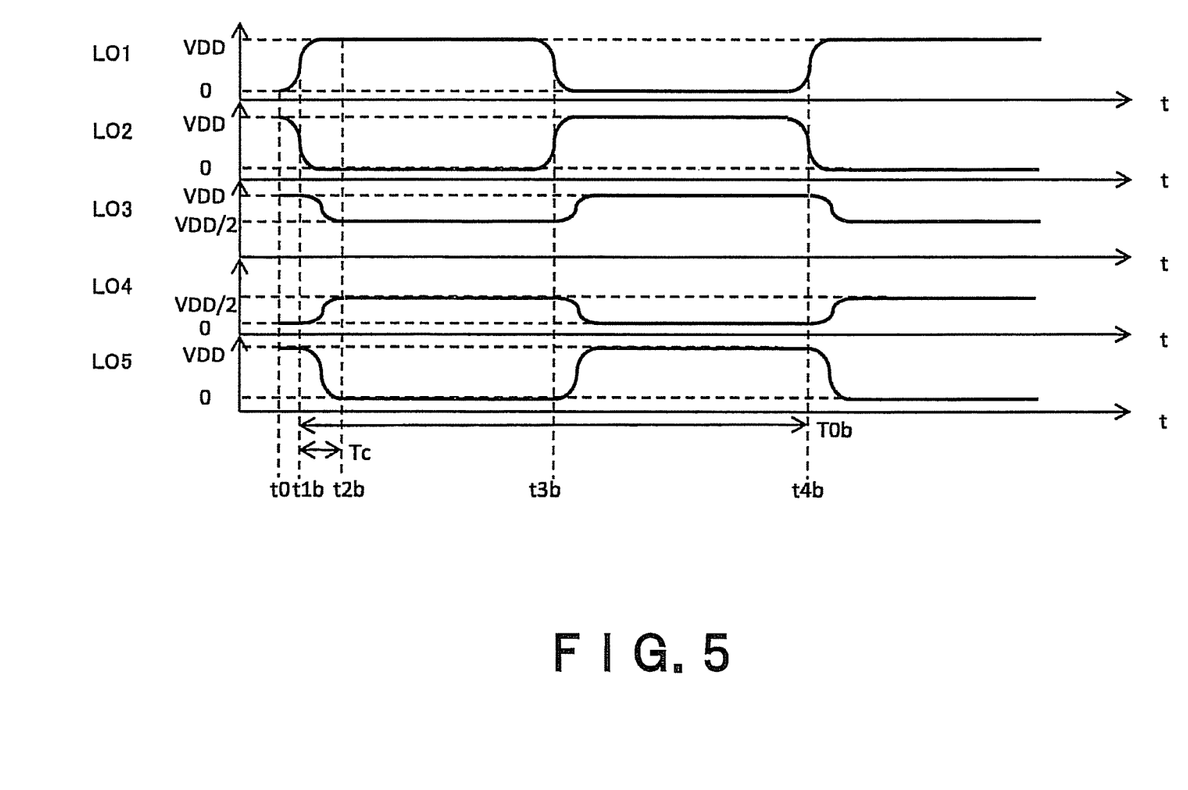
FIG. 5 is another voltage waveform of each signal of FIG. 2.

FIG. 5 is another voltage waveform of each signal of FIG. 2. FIG. 5 shows the operation when the frequency is low (for example, cycle T0*b*=2 ns, that is, the frequency fb=500 MHz). Hereinafter, the differences from the case where the frequency is high will be described.

When the signal LO1 becomes high from low at time t1*b*, the input and the output of the inverting amplifier circuit A3 are short-circuited, and thus, the voltage of the signal LO3 begins to decrease and the voltage of the LO4 begins to increase. Then, the signals LO3 and LO4 become stable at time t2*b* when the voltage of the signal LO3 and that of the signal LO4 coincide with each other. Since the term Tc (time t1*b* to t2*b*) is independent of the frequency of the LO signal as mentioned above, the term Tc of FIG. 5 is substantially the same as that of FIG. 3.

Then, although the gate of the transistor M1 is set to be high during time t2*b* to t3*b*, the voltage of the source and that of the drain is the same (VDD/2) and the current does not flow between the source and the drain. Therefore, the transistor M1 is effectively considered to be off. Further, the transistor M1 is off during time t3*b* to t4*b* when the gate of the transistor is set to be low.

Therefore, the duty ratio of the transistor M1 is Tc/T0*b* in FIG. 5, which is much smaller than 50%. Accordingly, although the transistor M1 can be considered as a resistance even when the frequency is low, the resistance value R is closer to the off-resistance Roff comparing to a case where the frequency is high. Since the off-resistance Roff is larger than the on-resistance Ron, Cin*R in the LO buffer LB1 of FIG. 2 becomes large. As a result, the cut-off frequency of the high pass filter becomes low, and the LO signal having a low frequency can pass the high pass filter.

Figure 6:
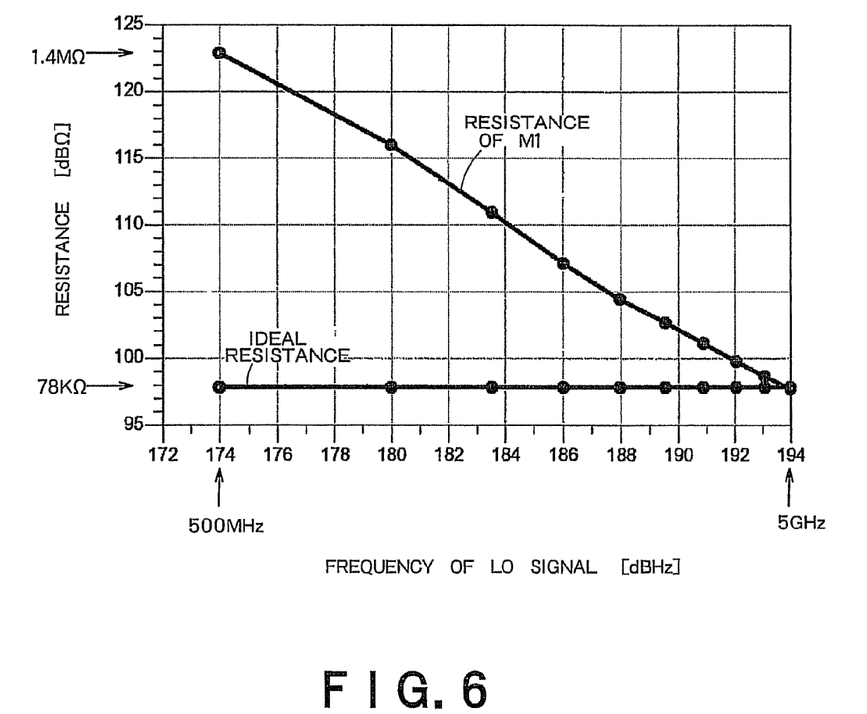
FIG. 6 is a graph showing a simulation result of the time-average resistance value of the transistor M1.

FIG. 6 is a graph showing a simulation result of the time-average resistance value of the transistor M1. The horizontal axis of FIG. 6 is a frequency of the LO signal represented in a unit of dBHz, and the vertical axis thereof is a resistance represented in a unit of dBΩ. As shown in FIG. 6, the resistance value of the transistor M1 increases linearly as the frequency becomes lower. Therefore, even when the capacitor Cin and the transistor M1 (resistance R) are formed in accordance with the LO signal having a high frequency, the LO signal having a low frequency also can pass the high pass filter formed by the capacitor Cin and the transistor M1.

As stated above, in the present embodiment, the LO buffer is formed using a MOS transistor. Therefore, the parasitic capacitance becomes small, thereby suppressing the attenuation of the LO signal. Furthermore, because the effective resistance of the MOS transistor becomes larger as the frequency of the LO signal becomes lower, signals of various frequency bands can be transmitted.

Here, although NMOS transistor M1 is formed in FIG. 2, PMOS transistor also can be used. In this case, basic operation principle is the same.

Figure 7:
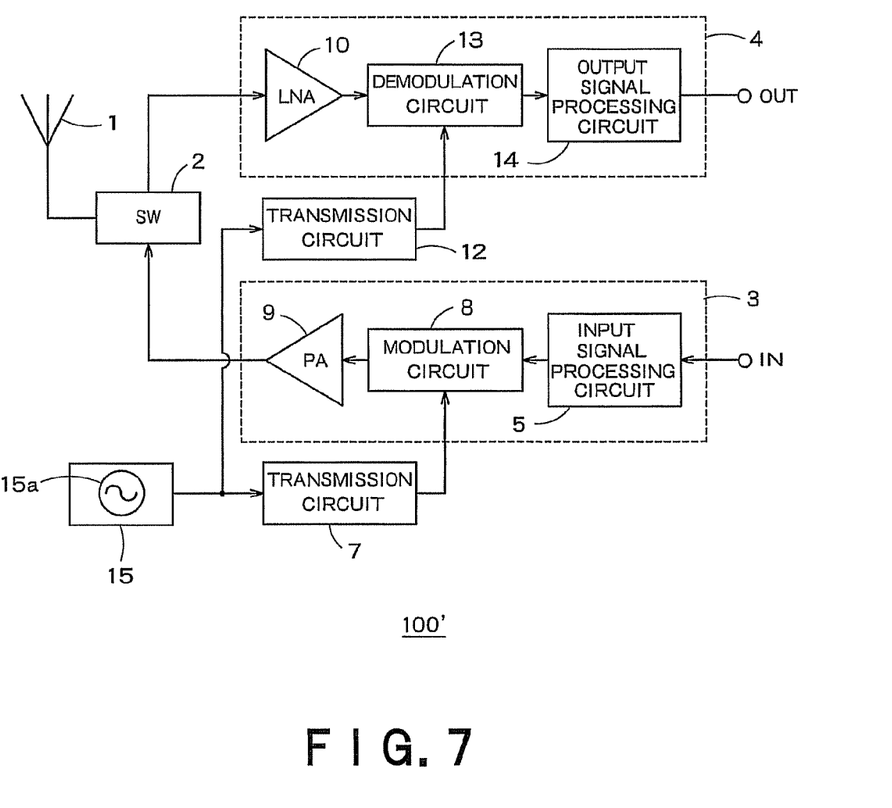
FIG. 7 is a schematic block diagram of a radio communication device 100'.

Furthermore, although the signal transmitter 3 and the signal receiver 4 have the PLL circuits 6 and 11, respectively in FIG. 1, it is possible to provide one PLL circuit 15 having a VCO 15*a* in a radio communication device 100' as shown in FIG. 7 and supply the LO signal to both of the signal transmitter 3 and the signal receiver 4 through the transmission circuit 12 and the transmission circuit 12 in a case of a communication standard in which the transmission and reception are performed time-divisionally. By such a manner, circuit are can be decreased.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A radio communication device comprising at least one of a signal transmitter and a signal receiver, wherein the signal transmitter comprises: a signal transmission circuit configured to modulate an input radio signal inputted from an outside based on a first oscillation signal, and to transmit the modulated input radio signal from an antenna; and a first transmission circuit configured to transmit the first oscillation signal to the signal transmission circuit, and the signal receiver comprises: a signal reception circuit configured to demodulate a reception signal received at the antenna based on the first oscillation signal or based on a second oscillation signal different from the first oscillation signal, and to output the demodulated reception signal to an outside; and a second transmission circuit configured to transmit the first or second oscillation signal to the signal reception circuit, wherein each of the first and the second transmission circuits comprises a plurality of buffer circuits connected in series, wherein each of the buffer circuits comprises: a capacitor comprising a first terminal and a second terminal, an input signal being inputted to the first terminal; a first inverting amplifier circuit configured to invert and amplify a signal of the second terminal of the capacitor; a second inverting amplifier circuit configure to invert and amplify an output signal of the first inverting amplifier circuit; and a MOS (Metal Oxide Semiconductor) transistor comprising a third terminal, a fourth terminal and a gate, the third terminal being connected to the second terminal of the capacitor, the fourth terminal being connected to a connection node of the first and the second inverting amplifier circuits, an inversion signal of the input signal being inputted to the gate.

2. The device of claim 1, wherein the signal transmitter comprises a first oscillation signal generation circuit configured to generate the first oscillation signal, the signal receiver comprises a second oscillation signal generation circuit configured to generate the second oscillation signal, and the signal reception circuit is configured to demodulate the reception signal received at the antenna based on the second oscillation signal.

3. The device of claim 1 further comprising a first oscillation signal generation circuit configured to generate the first oscillation signal, wherein the signal reception circuit is configured to demodulate the reception signal received at the antenna based on the first oscillation signal.

4. The device of claim 1, wherein each of the first and the second transmission circuits comprises: a third inverting amplifier circuit configured to invert and amplify the first or the second oscillation signal; and a fourth inverting amplifier circuit configured to invert and amplify an output signal of the third inverting amplifier circuit, wherein the output signal of the third inverting amplifier circuit is inputted to the gate of the MOS transistor of a first-stage buffer circuit among the buffer circuits as the inversion signal of the input signal.

5. The device of claim 1, wherein an output signal of the first inverting amplifier circuit of the buffer circuits is inputted to the gate of the MOS transistor of a subsequent buffer circuit among the buffer circuits as the inversion signal of the input signal.

6. A transmission circuit comprising a plurality of buffer circuits connected in series, wherein each of the buffer circuits comprises: a capacitor comprising a first terminal and a second terminal, an input signal being inputted to the first terminal; a first inverting amplifier circuit configured to invert and amplify a signal of the second terminal of the capacitor; a second inverting amplifier circuit configure to invert and amplify an output signal of the first inverting amplifier circuit; and a MOS (Metal Oxide Semiconductor) transistor comprising a third terminal, a fourth terminal and a gate, the third terminal being connected to the second terminal of the capacitor, the fourth terminal being connected to a connection node of the first and the second inverting amplifier circuits, an inversion signal of the input signal being inputted to the gate.

7. The circuit of claim 6, wherein an output signal of the first inverting amplifier circuit of the buffer circuits is inputted to the gate of the MOS transistor of a subsequent buffer circuit among the buffer circuits as the inversion signal of the input signal.

8. A buffer circuit comprising: a capacitor comprising a first terminal and a second terminal, an input signal being inputted to the first terminal; a first inverting amplifier circuit configured to invert and amplify a signal of the second terminal of the capacitor; a second inverting amplifier circuit configure to invert and amplify an output signal of the first inverting amplifier circuit; and a MOS (Metal Oxide Semiconductor) transistor comprising a third terminal, a fourth terminal and a gate, the third terminal being connected to the second terminal of the capacitor, the fourth terminal being connected to a connection node of the first and the second inverting amplifier circuits, an inversion signal of the input signal being inputted to the gate.

* * * * *